United States Patent [19]

Shuskus

[11] Patent Number: 4,706,377
[45] Date of Patent: Nov. 17, 1987

[54] PASSIVATION OF GALLIUM ARSENIDE BY NITROGEN IMPLANTATION

[75] Inventor: Alexander J. Shuskus, West Hartford, Conn.

[73] Assignee: United Technologies Corporation, Hartford, Conn.

[21] Appl. No.: 824,683

[22] Filed: Jan. 30, 1986

[51] Int. Cl.[4] .................... H01L 29/56; H01L 21/265
[52] U.S. Cl. .............................. 437/24; 148/DIG. 84; 148/DIG. 94; 357/61; 437/25; 437/41; 437/174; 437/22
[58] Field of Search ................ 29/571, 576 B, 576 T; 148/1.5, 187; 357/61

[56] References Cited

U.S. PATENT DOCUMENTS 4,559,238 12/1985 Bujatti et al. .................... 148/1.5

OTHER PUBLICATIONS

Makita et al., Appl. Phys. Letts., 35 (1979), 633.
IBM-TDB, 28 (1985), p. 196.
Wesch et al., Phys. Stat. Sol., 70a, (1982), 243.
Ahmed et al., Rad. Effects, 52 (1980), 211.

*Primary Examiner*—Upendra Roy
*Attorney, Agent, or Firm*—Eric W. Petraske

[57] ABSTRACT

A method of passivating a gallium arsenide surface includes the steps of implanting a subsurface layer of nitrogen ions and annealing and reactive the nitrogen to form a layer consisting primarily of gallium nitride.

6 Claims, 3 Drawing Figures

FIG. 1
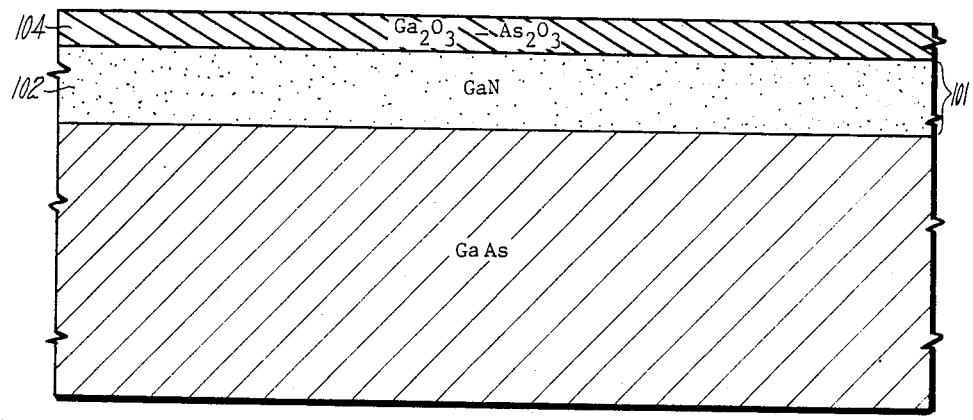
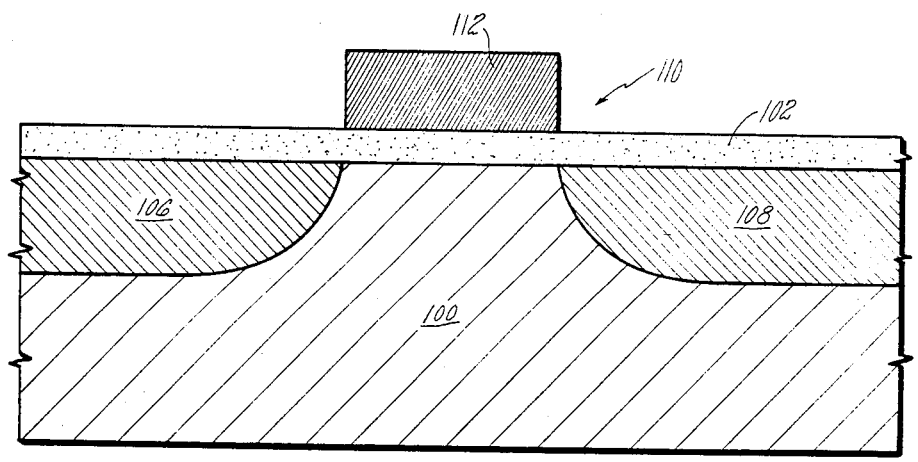
FIG. 3

PASSIVATION OF GALLIUM ARSENIDE BY NITROGEN IMPLANTATION

DESCRIPTION

1. Technical Field

The field of the invention is that of fabrication of integrated circuits composed of gallium arsenide.

2. Background Art

Workers in the field of gallium arsenide integrated circuits have found that the use of an oxide layer for passivation does not work. The use of silicon oxide as a passivation layer is standard in the field of silicon integrated circuits, but for gallium arsenide as little as 0.05% of a monolayer of oxygen has been found to be detrimental. Workers in the art have attempted to nitride the GaAs surface by thermal nitridation. This approach is not satisfactory because it results in the decomposition of GaAs.

DISCLOSURE OF INVENTION

The invention relates to a method of passivating gallium arsenide by ion-implanting nitrogen and annealing the device to form a subsurface passivation layer of gallium nitride avoiding potential problems due to a residual surface oxide layer.

BRIEF DESCRIPTION OF DRAWINGS

FIG. 1 illustrates a cross section of a gallium arsenide layer constructed according to the invention.

FIG. 3 illustrates a cross section of a gallium arsenide field effect transistor.

BEST MODE FOR CARRYING OUT THE INVENTION

Figure 2:
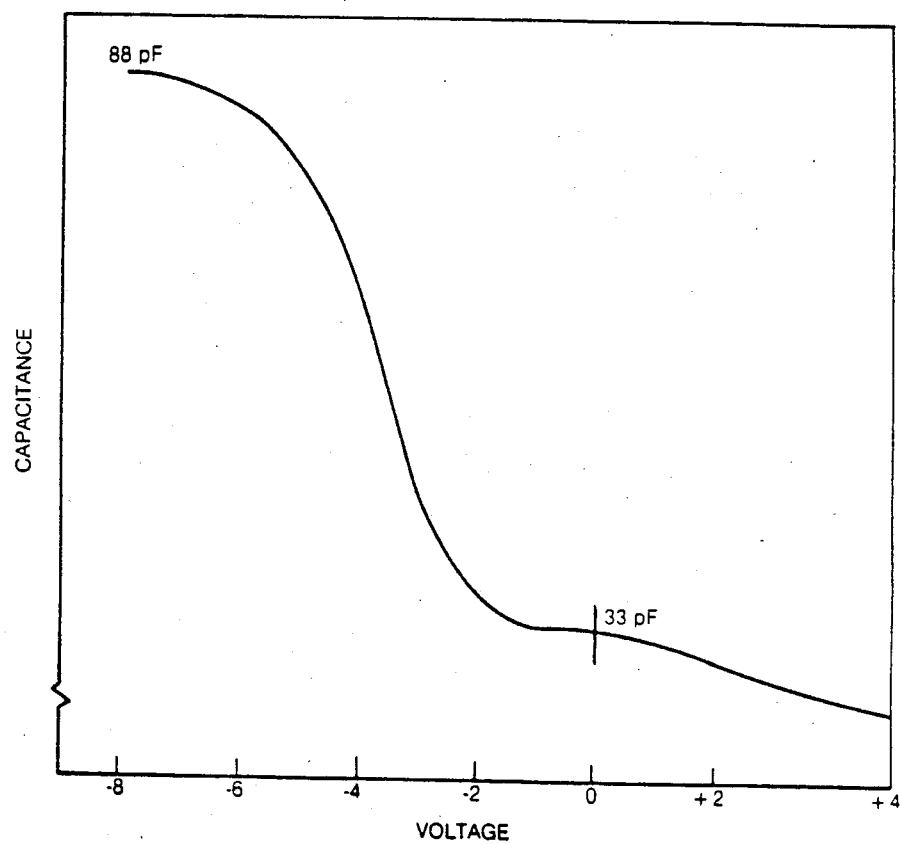
FIG. 2 illustrates the C-V dependence of the GaAs structure of FIG. 1.

The theoretical explanation as to why oxides do not work as surface passivation layers for gallium arsenide is that even a small amount of oxygen introduces a high density of extrinsic surface states which result in pinning of the Fermi level. This extreme sensitivity to oxygen has presented an intractable problem to workers in the field.

In the particular case of a GaAs FET, it is necessary that the surface of the active area under the gate electrode be passivated in order to eliminate surface states that would otherwise prevent transistor action.

FIG. 1 shows in cross section a P-type gallium arsenide substrate 100 having a surface layer 104 comprised of gallium and arsenic oxides which are normally formed on exposure to atmosphere. A sub-surface layer, indicated by the numeral 102 and having a depth indicated by the numeral 101 of approximately 1,000Å, has been formed by ion implanting nitrogen ions at a dose of $5 \times 10^{17}/cm^2$ at an energy of 25 KeV. The layer into which the implantation was done was a 2 micrometer thick P-type gallium arsenide layer doped to $5 \times 10^{16}/cm^3$ grown on a P+-gallium arsenide substrate. Following implantation, the specimen was thermally annealed in a hydrogen ambient at 300° C. for one hour. A temperature of 300°–400° C. is convenient. Any other convenient method such as pulsed annealing, by repetitively irradiating the surface with a laser beam, may also be used.

During the annealing process, the nitrogen reacts to form a volatile arsenic nitride and gallium nitride. The volatile AsN is given off, leaving behind a layer of gallium nitride throughout the region where the nitrogen ions are present. Gallium nitride has a band gap energy of 3.5 ev and is a relatively good insulator. Gallium nitride has the advantageous feature that it does not result in the generation of a high density of extrinsic surface states referred to above, and therefore forms a good passivation layer. Surface layer 104 may be etched away by HCl if contact to the underlying GaAS is required.

In order to confirm that the structure of FIG. 1 has a properly inverted surface layer, an aluminum electrode of 15 mils diameter was evaporated on the implanted surface and ohmic contact was made to the P+ substrate, giving a capacitor area of approximately 0.001 $cm^2$ that is a series combination of a depletion layer capacitance of 53 pf in the GaAs surface and an insulator (GaN) of thickness 1000 Angstroms and dielectric constant of 9 (88 pf). The calculated value for this series capacitance is 33 pf, corresponding exactly with the measured value at zero bias. Evidence for achieving surface inversion is shown in the capacitance voltage characteristic of FIG. 2. The bias voltage-dependent capacitance obtained at a frequency of $1MH_Z$ shows a maximum capacitance of 88 pf which is consistent with the thickness and dielectric constant given above. The minimum capacitance of 33 pf is consistent with the series combustion of a GaN insulator having a capacitance of 88 pf and a depletion layer capacitance of 53 pf for a p-type substrate of carrier concentration $5 \times 10^{16}/cm^3$ at inversion. For the case shown, inversion occurs at zero bias but, through further optimization of the annealing procedure, the contribution of the trapped charge in the dielectric film produced by implantation and annealing can shift the flat-band voltage as desired. It should be noted that there is no hysteresis in the C-V curve of FIG. 2, indicative of the stability of the dielectric layer, dielectric-semiconductor interface formed by implantation and annealing.

Referring now to FIG. 3, there is shown a cross suction of a field effect transistor 110 formed in a substrate 100 of gallium arsenide and having gate 112 and source and drain 106 and 108, respectively. Layer 102 of gallium nitride is now the gate insulator and also extends over the source and drain. Apertures will be opened in the gallium nitride layer 102 to form ohmic contacts with the source and drain as required. Gate 112 may be illustratively formed of aluminum in a standard transistor fabrication process. The gate may or may not be self-aligned. The remaining steps of the transistor fabrication process after layer 102 has been formed are conventional and are well known to those skilled in the art, as are the processes to prepare the substrate and/or to prepare a channel area. The sequence of steps may be varied as is convenient. For example, the source and drain may be formed before the nitrogen implantation process; after it and before the gate is formed; or after the gate is formed. The stability of these devices, as determined by examining the foregoing I-V curve after several years, is quite good.

The annealing step may be carried out in a conventional oven or may be carried out by pulsed annealing techniques.

Those skilled in the art will readily be able to employ this invention in the fabrication of field effect transistors, diodes or any other gallium arsenide circuit where an insulating layer or a passivation layer is required.

I claim:

1. A method of electrically passivating a gallium arsenide surface of a gallium arsenide body comprising the steps of:
   implanting a predetermined dose of nitrogen ions into said gallium arsenide body through said surface to form a nitrogen-doped subsurface layer in said gallium arsenide body, and heating said body, whereby at least some of said nitrogen replaces at least some of the arsenic in said gallium arsenide body in said subsurface layer to form a passivating layer partially composed of gallium nitride.

2. A method according to claim 1, further including the steps of reacting a portion of said nitrogen with arsenic to form arsenic nitride and driving out said arsenic nitride from said gallium arsenide body, leaving behind said passivating layer partially composed of gallium nitride.

3. A method according to claim 2, in which said dose is in the range of $10^{17}$–$10^{18}$ ions per square centimeter.

4. A method according to claim 2, in which said step of annealing is conducted by exposing said surface to a repetitively pulsed laser beam.

5. A method of forming a gallium arsenide field effect transistor comprising the steps of:
   implanting a gallium arsenide substrate with a predetermined dose of nitrogen ions to form a nitrogen-doped subsurface layer;
   heating said gallium arsenide substrate to a predetermined temperature for a predetermined period of time, thereby removing arsenic from said nitrogen doped subsurface layer and forming a subsurface layer of gallium nitride of predetermined depth;
   forming source and drain electrodes in said substrate extending below said gallium nitride subsurface layer; and
   forming a gate electrode above said gallium nitride subsurface layer and positioned between said source and drain electrodes, whereby said subsurface layer of gallium nitride insulates said gate electrode from a channel region of said gallium arsenide substrate positioned below said gate electrode and between said source and drain electrodes.

6. A method according to claim 5, in which said step of forming said source and drain electrodes comprises an electrode-implanting step and an electrode-annealing step; and
   said electrode implanting step and said step of implanting said predetermined dose of nitrogen are performed before said step of heating said gallium arsenide substrate and said electrode-annealing step is performed simultaneously with said step of heating said gallium arsenide substrate to form said layer of gallium nitride.

* * * * *